219-121 SR CROSS REFERENCE SEARCH ROOM
MTR04 XR 3,453,723

INVENTOR
Olin B. Cecil

BY John D. Graham

ATTORNEY

INVENTOR
Olin B. Cecil

BY John D. [signature]
ATTORNEY

United States Patent Office 3,453,723

Patented July 8, 1969

3,453,723

ELECTRON BEAM TECHNIQUES IN INTEGRATED CIRCUITS

Olin B. Cecil, Dallas, Tex., assignor to Texas Instruments Incorporated, Dallas, Tex., a corporation of Delaware Filed Jan. 3, 1966, Ser. No. 518,099
Int. Cl. B01j *17/00;* H01l *7/00*
U.S. Cl. 29—580 4 Claims

ABSTRACT OF THE DISCLOSURE

Disclosed is a method of producing hills or protuberances of material of and upon a crystalline substrate, each hill or protuberance having the same crystal orientation as the substrate, by directing a beam of energy upon the surface of the substrate for a time sufficient to produce such hills or protuberances.

This invention pertains to electron beam techniques in integrated circuits, and more particularly to the electron beam formation of protuberances or hills of monocrystalline semiconductor material in which circuit components are subsequently fabricated.

The increased demand for microminiaturization has been reflected in the electronics field by the development of integrated circuits whereby several hundred or more active and/or passive circuit components are formed in or on a single semiconductor slice. The most common method for the fabrication of an integrated network involves a series of process steps including oxide formation, photographic masking and etching, diffusion and metallization. Utilizing these techniques, a high concentration of circuit components is formed on a single semiconductor slice, resulting in a considerable reduction in space for electronic systems and sub-systems.

The demand for an even higher concentration of circuit components, however, requires new techniques to be developed for the fabrication of integrated networks. It is therefore a primary object of the invention to provide for the fabrication of an integrated network by techniques which result in a larger concentration of circuit components upon a single slice of semiconductor material. It is another object of the invention to utilize a concentrated beam of energy, as an electron beam, to form protuberances or hills of monocrystalline semiconductor material in which individual components of an integrated circuit may then be formed. It is a further object of this invention to utilize electron beam techniques in fabricating an integrated network wherein the circuit components are electrically isolated from one another.

The novel features believed to be characteristic of this invention are set forth with particularity in the appended claims. The invention itself, however, as well as further objects and advantages thereof, may best be understood by reference to the following detailed description of illustrative embodiments, when read in conjunction with the accompanying drawings, in which:

Figure 1:
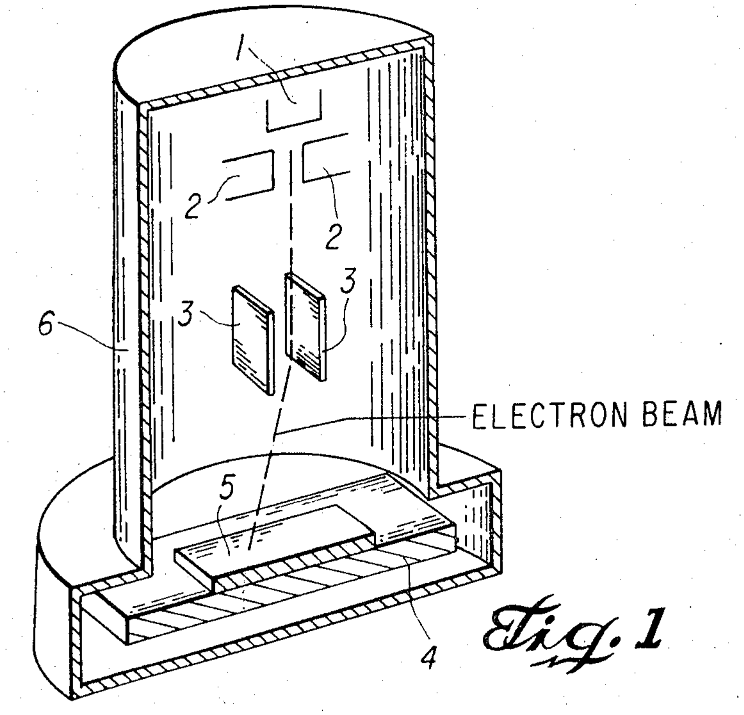
FIGURE 1 is a diagram of one form of apparatus used in practicing the invention.

The drawings are not necessarily to scale as dimensions of certain parts as shown in the drawings have been modified and/or exaggerated for clarity of illustration.

A slice of single crystal semiconductor material is used as the starting material. The slice may be about one inch in diameter and approximately 10 mils thick. A small segment of the slice may be represented as a chip or wafer 5 shown in FIGURES 1 and 2, which represents the segment occupied by just one portion of an integrated network. Actually the slice would contain dozens or even hundreds of the segments such as the wafer 5. Although the wafer may be of any semiconductor material, as well as of any initial resistivity, the invention will be described initially with reference to single crystal low resistivity N+ silicon semiconductor material having a resistivity of perhaps 0.010 to 0.025 ohm-cm. The wafer 5 is placed upon the insulating support 4 within a chamber 6, the chamber 6 preferably being highly evacuated. At one end of the chamber is an electron gun for producing a concentrated electron beam, the gun being one of a variety of known constructions, and including a cathode portion 1 and a concentrating and accelerating portion 2. The trace of the electron beam upon the face of the wafer 1 is controlled by means such as the deflector plate 3 shown in the diagram.

Figure 2:
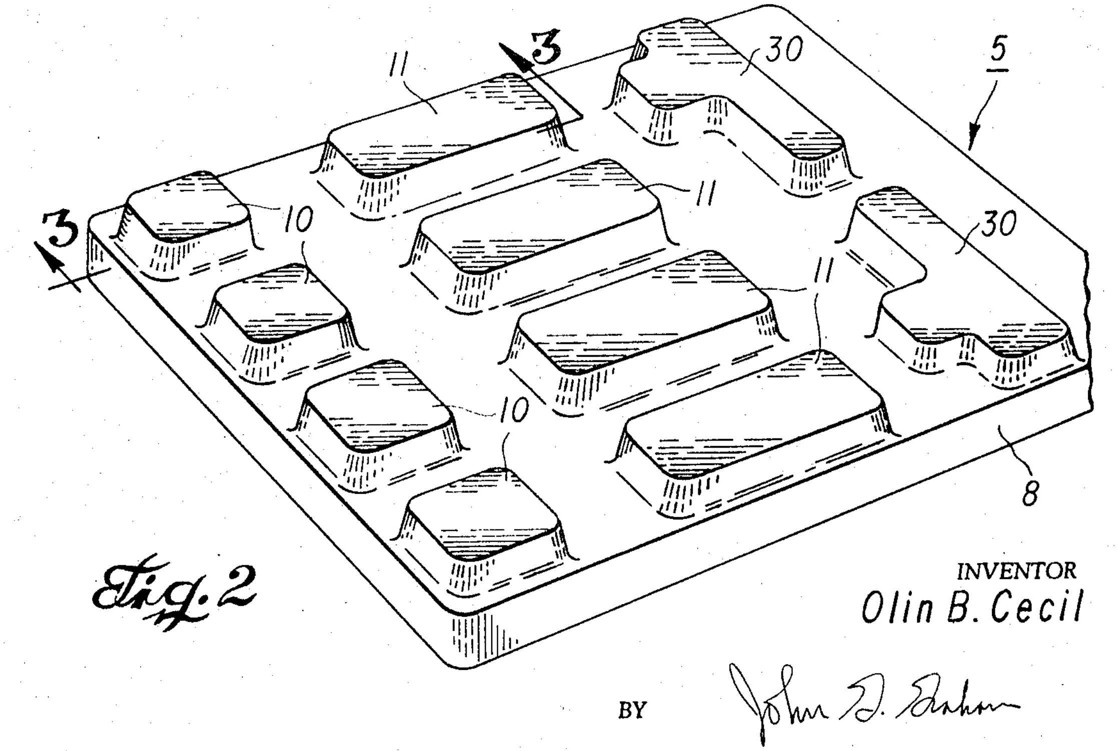
FIGURE 2 is a pictorial view of a semiconductor wafer having a plurality of protuberances or hills of monocrystalline material formed thereon according to the process of the invention.

In the fabrication of an integrated network in accordance with this invention, the electron beam from the gun is directed at the wafer 5, as shown in FIGURE 1, and pulsed across the surface in a predetermined configuration. As a result of this pulsing, a plurality of protuberances or "hills" 10, 11, and 30 of single crystalline silicon material is formed as shown in FIGURE 2 upon the low resistivity N+ substrate portion 8 of the wafer 5. It is to be noted at this point that the hills are not formed by cutting or etching notches in the substrate 8, but rather by forming peaks of monocrystalline material above the original surface of the wafer 5. These hills of semiconductor material may now serve as regions into which various components may be formed by various techniques.

Figure 3:
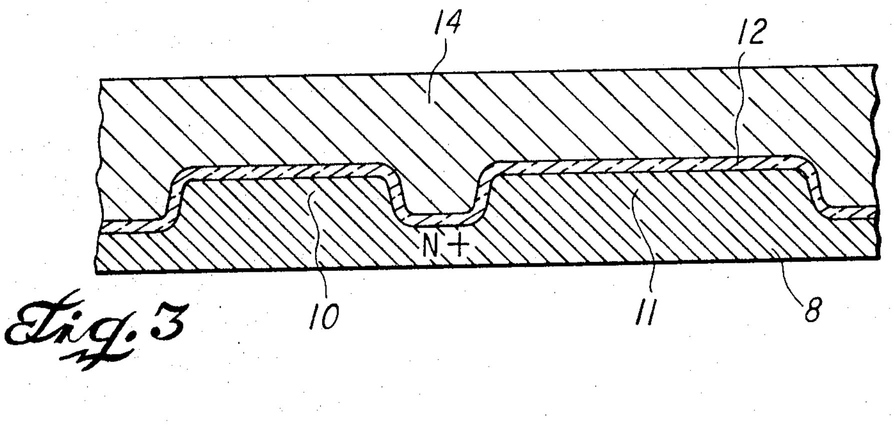
FIGURES 3, 4, and 5 are sectional views showing subsequent steps in the fabrication of an integrated circuit.
Figure 4:
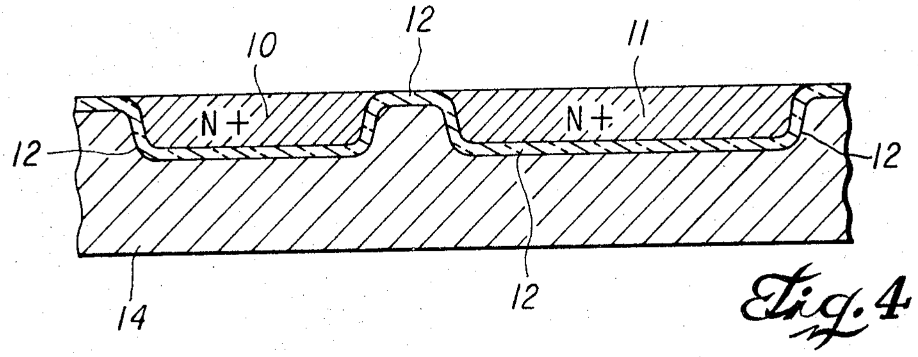
Figure 5:
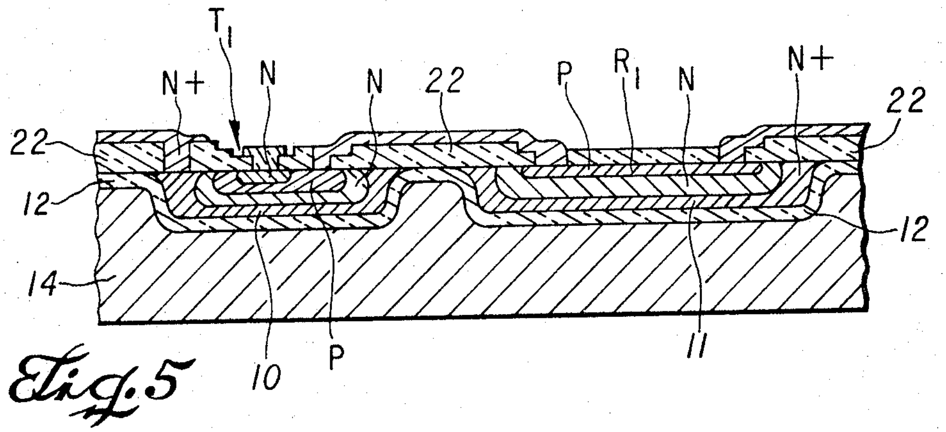

In accordance with one specific embodiment of the invention, an insulating or dielectric layer 12 of silicon oxide, for example, is formed over the electron-beam formed hills 10 and 11, as shown in FIGURE 3. As the next step, a layer 14 of polycrystalline semiconductor material is deposited over the oxide-coated hills to a thickness of perhaps 7 or 8 mils or more to facilitate handling the unit without breakage. The structure of FIGURE 3 is then subjected to a lapping and polishing treatment on its lower face to remove all of the original N+ material except those portions remaining within the hills 10 and 11, and then inverted to give the structure shown in FIGURE 4. Each of the low resistivity portions 10 and 11 is insulated from each other and from the substrate layer 14 by the silicon oxide coating 12. Thereafter, using various techniques known in the art, as ion implantation, electron beam diffusion, or alternatively the process described in copending U.S. patent application Ser. No. 435,633, filed Feb. 26, 1965, and assigned to the assignee of the present invention, individual circuit components are formed within the monocrystalline portions 10 and 11 as shown in FIGURE 5. Referring to FIGURE 5, a sectional view of a portion of an integrated circuit is seen with an N-P-N transistor $T_1$ and resistor $R_1$ having been formed by diffusion in the regions 10 and 11, respectively. Openings are made in an oxide layer 22 where necessary, metal film having been deposited over the oxide and selectively removed to provide the desired contacts and interconnections.

The dimensions and the locations of the various protuberances or hills of the single crystalline material are determined by controlling or programming the electron beam in order to produce the desired pattern. For example, the location of the individual hills may be controlled by varying the rate at which the electron beam sweeps the surface of the wafer 5, and also varying the pulse frequency of the beam. The variation in sweep rate may be accomplished by having the electron beam itself move across the surface of the slice which is secured to a conventional jig, or alternatively move the slice in a prescribed manner, the electron beam being fixed. In this manner the hills may be selectively formed and located in a prescribed pattern.

In addition, it is often desirable to form the various protuberances or hills of various dimensions; the resistors in an integrated network for example ordinarily require more area than a transistor. By varying the electron beam power and/or changing the focus of the beam (thereby increasing or decreasing the electron beam spot) monocrystalline hills 11 shown in FIGURE 2 may be formed to a larger area than hills 10, the hills 11 thereby being provided for the subsequent formation of resistors. In addition, utilizing a combination of the above controls, one is able to form hills of monocrystalline material of various configurations and sizes as represented by the protuberances or hills 30 shown in FIGURE 2.

For one particular example, a silicon wafer was used as the target. The accelerating beam voltage was maintained at approximately 100 kev., the beam current at slightly less than 5 micro-amps, and the pulse frequency at approximately 250 c.p.s. The rate of travel of electron beam across the face of the slice was approximately .4 inch per second, and the diameter of the electron beam spot was approximately 1.5 milli-inch. Under these operating conditions approximately $57 \times 10^4$ protuberances or hills per square inch were formed on the face of the wafer, the height of each hill above the surface of the wafer being approximately .4 milli-inch, its width approximately .8 milli-inch, and the distance from the center of one hill to the center of the next hill being approximately 1.5 milli-inch. Under the same operating conditions the results were approximately the same when a germanium semiconductor wafer was used as the target material. Examination of the individual hills revealed that the geometry of these hills was related to the crystal plane orientation of the starting material. In other words, when the substrate was a monocrystalline [111] surface, the peaks likewise had monocrystalline [111] surfaces.

The very fine resolution which may be achieved with the electron beam therefore enables very precise patterns of these hills to be formed by a technique which is not only simpler but also enables a higher degree of microminiaturization than that previously obtainable by photographic masking and etching techniques. It is to be pointed out as a particular feature of the invention that since the hills or protuberances are of single crystalline material, the slices with these hills formed upon their faces may be placed in an epitaxial reactor and additional material grown upon the hills in order to "thicken" the hills.

Although the invention has been described with specific reference to an electron beam, it is also contemplated that other concentrated sources of energy, such as a laser, may be utilized in like manner to form the plurality of protuberances or hills of monocrystalline material. In addition, although germanium and silicon have been specifically referred to as the starting material of the slices, this is not to be construed in a limiting sense and other semiconductor materials including the compound semiconductor materials may be operated on in the same manner. Although the great advantage of the process of the present invention lies in its utility in the fabrication of integrated networks, it may also be used in the fabrication of discrete components. Various other modifications of the disclosed embodiment, as well as other embodiments of the invention, may become apparent to persons skilled in the art without departing from the spirit and scope of the invention as defined by the appended claims.

What is claimed is:

1. A method of fabricating an integrated circuit comprising the steps of:

(a) adjusting the power density of a beam of energy to a predetermined level, the maximum said predetermined level being the power density required to produce hills or protuberances on a surface of a single crystalline semiconductor body without causing any of the material of said body to be permanently disassociated when said beam of energy is directed upon said surface of said body;

(b) pulsing said beam of energy across said surface of said body to form a plurality of protuberances or hills of single crystalline semiconductor material upon said surface; and (c) forming individual circuit components within each

2. The method as described in claim 1 including the step of epitaxially growing additional single crystalline material upon said plurality of protuberances or hills to thicken said protuberances or hills.

3. The method as described in claim 1 including the step of programming said pulsing to produce a predetermined pattern of said protuberances or hills having predetermined configurations and dimension.

4. A method of fabricating an integrated circuit, comprising the steps of:

(a) adjusting the power density of an electron beam to a predetermined level, the maximum said predetermined level being the power density required to produce hills or protuberances on a surface of a body of monocrystalline semiconductor material without causing said material to be cut, removed, or permanently evaporated when said electron beam is caused to fall upon said surface of said body;

(b) pulsing said electron beam across said surface of said body of monocrystalline semiconductor material to form a plurality of hills of monocrystalline semiconductor material upon said surface;

(c) forming an insulating layer over said plurality of hills;

(d) forming a layer of semiconductor material upon said insulating layer;

(e) removing substantially all of the monocrystalline semiconductor material of said body except the portion which comprises said hills; and (f) forming individual components within each of said hills, said components thereby being electrically isolated from one another by said insulating layer.

References Cited

UNITED STATES PATENTS

| | | | |
|---|---|---|---|
| 2,778,926 | 1/1957 | Schneider | 29—584 X |
| 3,290,753 | 12/1966 | Chang | 29—577 |
| 3,312,879 | 4/1967 | Godejahn. | |
| 3,340,601 | 9/1967 | Garibotti | 29—582 |

OTHER REFERENCES

Electronics Review, vol. 37, No. 17, page 23, June 1, 1964.

WILLIAM I. BROOKS, *Primary Examiner.*

U.S. Cl. X.R.

29—577; 72—54; 117—93.3, 213; 148—1.5; 219—121